(12) United States Patent  
Choi

(10) Patent No.: US 8,094,464 B2  
(45) Date of Patent: Jan. 10, 2012

(54) PORTABLE TERMINAL

(75) Inventor: Byung-Sung Choi, Gyeonggi-Do (KR)

(73) Assignee: LG Electronics Inc., Seoul (KR)

( * ) Notice: Subject to any disclaimer, the term of this patent is extended or adjusted under 35 U.S.C. 154(b) by 365 days.

(21) Appl. No.: 12/421,579

(22) Filed: Apr. 9, 2009

(65) Prior Publication Data

US 2009/0303691 A1 Dec. 10, 2009

(30) Foreign Application Priority Data

Jun. 9, 2008 (KR) ........................ 10-2008-0053710

(51) Int. Cl.  
*H05K 1/14* (2006.01)

(52) U.S. Cl. .................. 361/814; 361/768; 361/679.01; 439/66

(58) Field of Classification Search ............. 361/679.26, 361/679.3, 679.55, 679.56, 719–722, 729–737, 361/748, 760, 768, 803, 814; 455/73; 439/9, 439/17, 65, 66, 91, 591, 700, 943, 948, 951, 439/607.53, 632, 672, 607.12, 74–75; 174/250  
See application file for complete search history.

(56) References Cited

U.S. PATENT DOCUMENTS

| 6,491,543 | B1 * | 12/2002 | Yatskov .................... 439/493 |
| 6,940,024 | B2 * | 9/2005 | Watanabe .................... 174/261 |
| 7,239,700 | B2 * | 7/2007 | Fuhrmann et al. ....... 379/433.11 |
| 7,384,272 | B2 * | 6/2008 | Na .................................. 439/67 |
| 7,626,672 | B2 * | 12/2009 | Song .............................. 349/150 |
| 7,632,108 | B2 * | 12/2009 | Bae ................................. 439/74 |
| 7,792,558 | B2 * | 9/2010 | Bang et al. ................. 455/575.4 |
| 2008/0037770 | A1 * | 2/2008 | Emmert ................... 379/433.01 |
| 2009/0175019 | A1 * | 7/2009 | Koyama et al. ............. 361/803 |
| 2010/0091439 | A1 * | 4/2010 | Horii ........................ 361/679.01 |

* cited by examiner

Primary Examiner — Angel R Estrada  
Assistant Examiner — Dimary Lopez  
(74) Attorney, Agent, or Firm — Lee, Hong, Degerman, Kang & Waimey

(57) ABSTRACT

Disclosed is a portable terminal, including a first circuit board coupled to a main body and having a first connection terminal mounted on a surface thereof; a second circuit board coupled to the main body so as to cover at least a portion of the first circuit board, having a first area where an intermediate connection terminal contacting the first connection terminal is mounted on a surface thereof, and a second area where a second connection terminal electrically connected to the intermediate connection terminal is mounted on a surface thereof; and an electronic component having at least a portion thereof contacted by the second connection terminal, and for being electrically connected to the first circuit board.

12 Claims, 5 Drawing Sheets

PORTABLE TERMINAL

RELATED APPLICATION

The present disclosure relates to subject matter contained in priority Korean Application No. 10-2008-0053710, filed on Jun. 9, 2008, which is herein expressly incorporated by reference in its entirety.

BACKGROUND OF THE INVENTION

1. Field of the Invention

The present invention relates to a portable terminal having a circuit board electrically connected to an electronic component.

2. Background of the Invention

In general, a portable terminal is a portable device which is equipped with one or more functions among a voice/video communication function, an information input/output function, a data storage function, and the like.

As the functions thereof become diversified, the portable terminal has been implemented as an integrated multimedia player which incorporates a variety of complicated functions, such as capturing images or video, replaying music files or video files, playing games, receiving broadcasts, and the like.

Efforts are ongoing to support and increase the functionality of portable terminals. Such efforts include software and hardware improvements. As an example, a user interface environment is provided such that a user may conveniently search for and select functions.

An electrical connection between electronic components and a circuit board may be considered in implementing the multimedia player.

SUMMARY OF THE INVENTION

Therefore, an object of the present invention is to provide a portable terminal having a circuit board electrically connected to electronic components in a different manner from related art.

Another object of the present invention is to provide a portable terminal having a stable electrical connection between electronic components and a circuit board.

To achieve these and other advantages and in accordance with the purpose of the present invention, as embodied and broadly described herein, there is provided a portable terminal, including a first circuit board coupled to a main body, and a second circuit board coupled to the main body so as to cover at least a portion of the first circuit board. A first connection terminal is mounted on a surface of the first circuit board. The second circuit board includes a first area and a second area. An intermediate connection terminal is mounted on a surface of the first area, and a second connection terminal is mounted on a surface of the second area. The intermediate connection terminal is contacted by the first connection terminal, and is electrically connected to the second connection terminal. The second connection terminal contacts at least a portion of an electronic component. Thusly, the first circuit board and the electronic component are electrically connected. The electronic component may be an antenna.

According to one aspect of the present invention, a support member is coupled to the main body. The first circuit board is mounted at one surface of the support member, and the second circuit board is mounted at another surface thereof. First and second through-holes may be formed at the support member. The first through-hole is formed to correspond to the first area and pass the first connection terminal or the intermediate connection terminal therethrough. The second through-hole is formed to correspond to the second area and pass the second connection terminal or at least a portion of the electronic component therethrough.

According to another aspect of the present invention, the intermediate connection terminal and the second connection terminal are electrically connected by a circuit pattern of the second circuit board. One end portion of the circuit pattern is coupled to the intermediate connection terminal, and another thereof is coupled to the second connection terminal.

According to still another aspect of the present invention, the first connection terminal includes a first contact surface which protrudes from the surface of the first circuit board on which the first connection terminal is mounted. The first contact surface may be formed parallel to the surface of the first circuit board. The intermediate connection surface includes an intermediate contact surface which protrudes from the second circuit board. The intermediate contact surface may be formed to contact the first contact surface. The second connection terminal includes a second contact surface which protrudes from the second circuit board. The second contact surface may be formed to contact a portion of the electronic component. The first, intermediate or second connection terminal may be implemented as an elastic member.

According to still another aspect of the present invention, the first and intermediate connection terminals are configured to press each other when contacting each other. The first and intermediate contact surfaces are formed to have a surface-to-surface contact by being elastically deformed while pressing each other. The second connection terminal and at least the portion of the electronic component are configured to press each other when contacting each other. The second contact surface and the portion of the electronic component are formed to have a surface-to-surface contact by being elastically deformed while pressing each other.

According to still another aspect of the present invention, the portable terminal further includes a third circuit board electrically connected to the first circuit board. The third circuit board is mounted to cover at least a portion of the first circuit board. The portable terminal further includes a protection sheet disposed between the first and third circuit boards for reflecting or absorbing electromagnetic waves.

The foregoing and other objects, features, aspects and advantages of the present invention will become more apparent from the following detailed description of the present invention when taken in conjunction with the accompanying drawings.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE INVENTION

Figure 1:
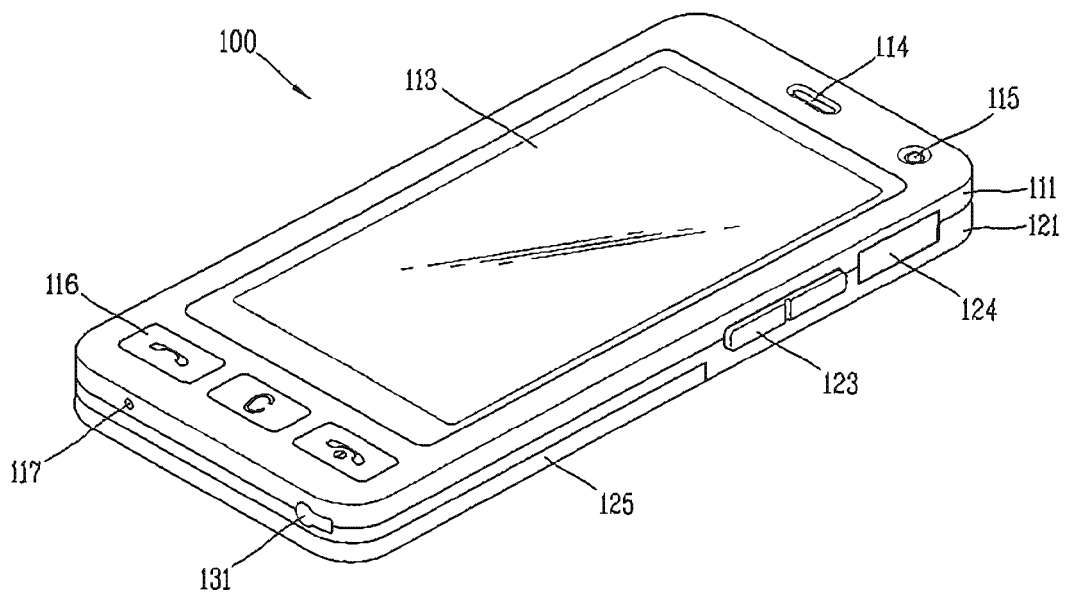
FIG. 1 is a front perspective view of a portable terminal according to one exemplary embodiment of the present invention.

Description will be given in detail of the portable terminal according to the present invention, examples of which are illustrated in the accompanying drawing. In addition, the same reference numerals will be given to the same or similar components having the same or similar functions, and for the sake of convenience in explanations, detailed explanations therefor are omitted. A singular expression includes a plural expression except that two expressions are contextually different from each other.

FIG. 1 is a front perspective view of a portable terminal 100 according to one exemplary embodiment of the present invention.

A case (a casing, a housing, a cover, or the like) constituting the external appearance of a main body of the portable terminal is formed by a front case 111 and a rear case 121. Here, the present invention is not meant to be limiting, and may also be applied to a variety of types of portable terminals, such as a slide-type, a folder-type, a swing-type, a swivel-type and the like.

Various electronic components are installed in a space between the front case 111 and the rear case 121. One or more intermediate cases may be additionally disposed between the front case 111 and the rear case 121.

The cases may be formed by injection-molding a synthetic resin or may be made of a metallic material such as stainless steel (STS) or titanium (Ti), and the like.

A display 113, a first audio output unit 114, a first video input unit 115, a first user input unit 116, an audio input unit 117, and the like may be located on the front case 111.

The display 113 may include a display module 113b (refer to FIG. 3) such as a Liquid Crystal Display (LCD), an Organic Light Emitting Diode (OLED) display, or the like that visually displays information. The display 113 may be implemented as a touch screen to enable an inputting of information by a user's touch.

The display 113 may be configured to generate various tactile effects when being touched. This may be implemented by a haptic module in cooperation with the display 113. A representative example of the tactile effects generated by the haptic module includes vibration. This haptic module may be disposed in various positions, in addition to the display 113, according to the configuration of the portable terminal.

The first audio output unit 114 may be implemented in the form of a receiver or a speaker.

The first video input unit 115 may be implemented as a camera module to be suitable for capturing images or video with respect to the user and so on.

The first user input unit 116 receives an input of a command to control overall operations of the portable terminal 100 according to one exemplary embodiment of the present invention.

The audio input unit 117 may be implemented as a microphone to receive a voice of a user, other sounds, or the like.

A second user input unit 123, an interface 124, a power supplying unit 125 and the like may be installed at the rear case 121 mounted on the rear surface side of the portable terminal 100.

The second user input unit 123 may be installed at a side surface of the rear case 121. The second user input unit 123, together with the first user input unit 116, may be generally referred to as the manipulation unit, and various techniques can be employed for implementing the manipulation unit so long as they can be operated by a user in a tactile manner. For instance, the user input units can be implemented with a dome switch or a touch screen, a touch pad that can receive user commands or information according to a user's pressing, pushing or touching, or implemented in the form of a wheel that rotates a key, a jog element, a joystick, or the like.

In terms of their functions, the first user input unit 116 is used for inputting commands such as start, end, scroll or the like, and the second user input unit 123 may operate as a hot key for activating a particular function within the portable terminal (e.g., activating the first video input unit 115), in addition to the scroll function. If the first and second user input units 116, 123 are to be minimized as shown in the drawing, a touch screen disposed on the display 113 may receive an inputting of information, such as a telephone number, a text or the like.

The interface 124 may be used as a link (passage or path) through which the portable terminal 100 can exchange data or the like with an external device. For instance, the interface 124 may be implemented as at least one of a connection port for connecting an earphone to the portable terminal via a wired (fixed) or wireless means, a port for short-range communications (e.g., an Infrared Data Association (IrDA) port, a Bluetooth™ port, a wireless LAN port, etc.), power supply ports for providing power to the portable terminal 100, or the like. The interface 124 may be configured using a card socket (e.g., for coupling to an external card including a Subscriber Identity Module (SIM) card, a User Identity Module (UIM) card, and a memory card for information storage.

The power supplying unit 125 for supplying power to the portable terminal 100 is located at the rear case 121. The power supplying unit 125 may be, for example, a rechargeable battery that can be detached.

Figure 2:
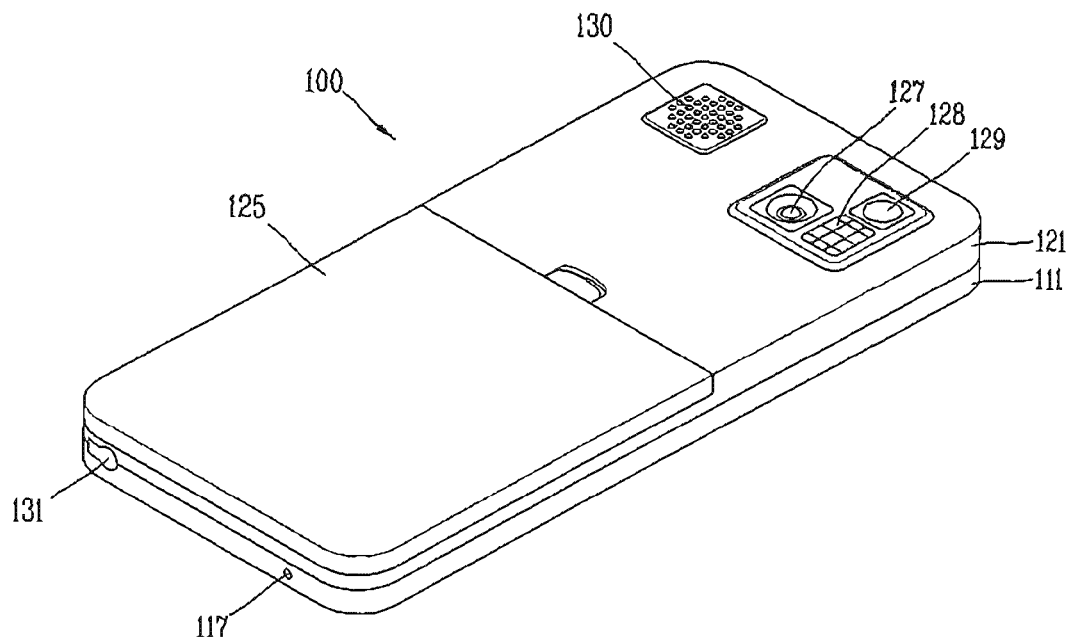
FIG. 2 is a rear perspective view of the portable terminal according to one exemplary embodiment of the present invention.

FIG. 2 is a rear perspective view of the portable terminal 100 in FIG. 1.

Referring to FIG. 2, a second video input unit 127, a second audio output unit 130, a broadcast signal receiving antenna 131, and the like may additionally be disposed on the rear case 121.

The second video input unit 127 may have an image capturing direction which is substantially the opposite to that of the first video input unit 115 (refer to FIG. 1), and may be a camera supporting a different resolution, image size, or number of pixels as compared to the first video input unit 115. For instance, the first video input unit 115 may operate with a relatively lower resolution to capture images of a user's face and transmit the same to the other party during video call communication or the like, while the second video input unit 127 may operate with a relatively higher resolution to capture images of general subjects with high picture quality not for immediately being transmitted but for later use or for communicating to others.

A flash 128 and a mirror 129 may be additionally disposed adjacent to the second video input unit 127. When an image of a subject is to be captured with the second video input unit 127, the flash 128 illuminates the subject. The mirror 129 allows a user to see themselves when they want to capture their own image (self-image capturing) by using the second video input unit 127.

The second audio output unit 130 may implement a stereophonic sound function in conjunction with the first audio output unit 114 (refer to FIG. 1) and may be also used for sending and receiving audio calls in a speaker phone mode.

The broadcast signal receiving antenna 131 may be disposed at one side or region of the rear case 121, in addition to an antenna that supports mobile communications. The antenna 131 can be configured to be retractable from the rear case 121.

In the above description, the first user input unit 116 and so on is disposed on the front case 111, and the second user input unit 123 and so on is disposed on the rear case 121, but such described configuration is not meant to be limiting. For instance, the second user input unit 123 may be disposed at the front case 111 so as to be adjacent to be the first user input unit 116. In addition, even if the second video input unit 127 is not provided, the first video input unit 115 may be configured to rotate (or otherwise be moved) to thus allow image capturing in various directions.

Figure 3:
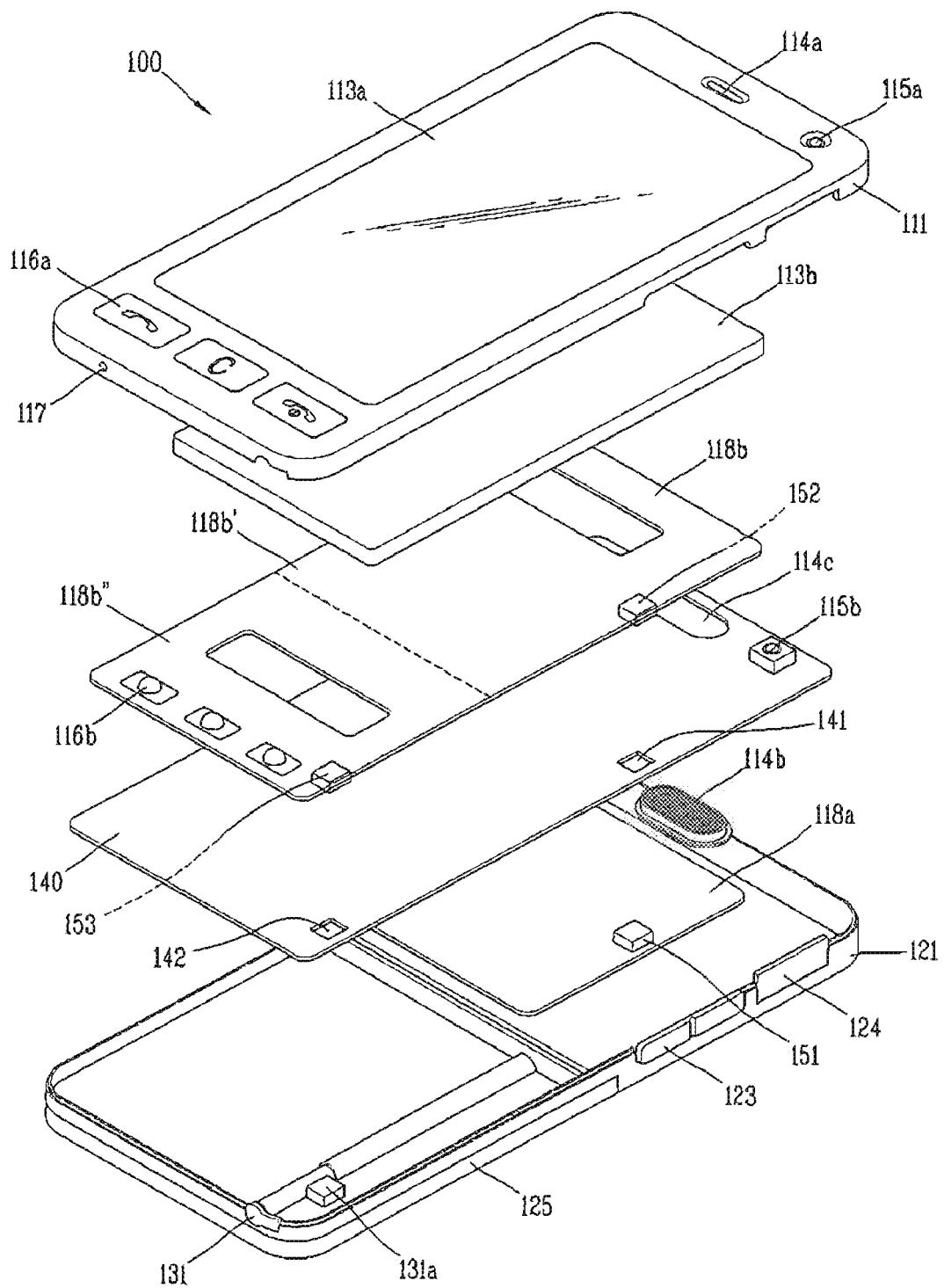
FIG. 3 is an exploded perspective view of the portable terminal in FIG. 1.
Figure 4:
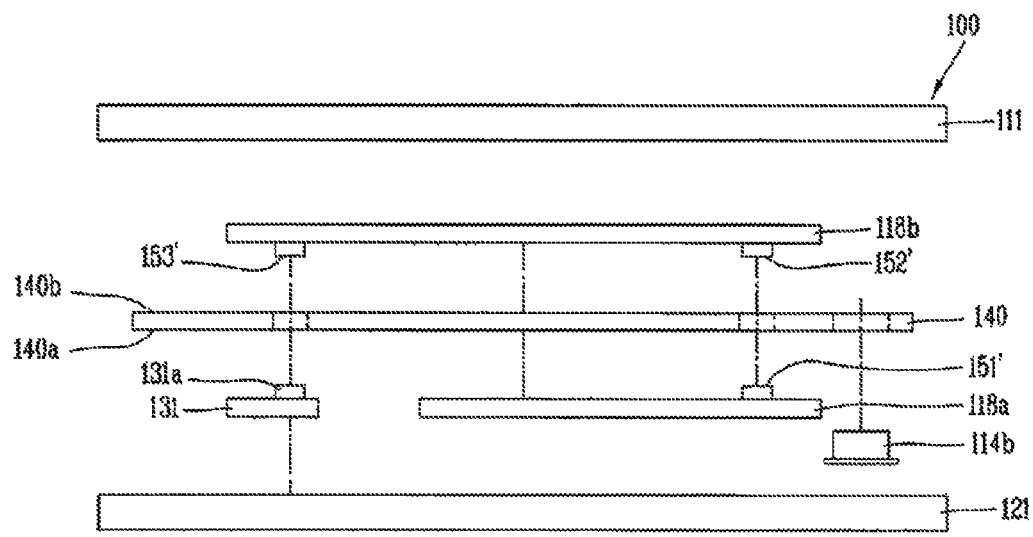
FIG. 4 is a schematic view showing a coupling relation of the portable terminal in FIG. 3.

FIG. 3 is an exploded perspective view of the portable terminal 100 in FIG. 1, and FIG. 4 is a schematic view showing a coupling relation of the portable terminal 100 in FIG. 3.

Referring to FIGS. 3 and 4, a window 113a is coupled at one surface of the front case 111. The window 113a covers one surface of a display module 113b such that visual information outputted from the display module 113b is viewed (recognized) from the outside. The display module 113b may be coupled to the front case 111, and forms the display 113 together with the window 113a (refer to FIG. 1).

The window 113a may be configured to recognize a user's touch. In this case, the window 113a may receive an inputting of information (e.g., a command, a signal, and the like) by a user's touch.

The window 113a may have an area corresponding to the display module 113b and is formed of a light transmitting material. The window 113a may have a semi-transmissive region where light transmission is blocked or a light transmission rate is very low. For instance, edges of the window 113a may undergo a surface treatment for blocking any light transmission.

A manipulation pad 116a may be formed on the front case 111, in correspondence to the first user input unit 116. The manipulation pad 116a allows the user to perform a touch or press operation thereon.

The manipulation pad 116a may function as a manipulation area at a portion of the window 113a.

A sound hole 114a and a video window 115a may be formed at the front case 111.

The sound hole 114a is formed to correspond to the audio output unit 114, and outputs audio sounds (e.g., a ringtone, a music, and the like) of the portable terminal to the outside. The light transmissive video window 115a may be formed to correspond to the first video input unit 115 (refer to FIG. 1).

A support member 140 may be mounted at the front case 111 or the rear case 121.

The support member 140 may be formed of an insulating material such as a synthetic resin and the like. At least a portion of the support member 140 may be coated with an electromagnetic interference (EMI) shielding material.

A speaker module 114b, a camera module 115b or the like may be disposed on the support member 140. The speaker module 114b is disposed to correspond to the sound hole 114a, and the camera module 115b is disposed to correspond to the video window 115a. As shown in the drawing, the speaker module 114b is mounted at one surface 140a of the support member 140, and the camera module 115b may be mounted at another surface 140b thereof. In correspondence to the sound hole 114a of the front case 111, the support member 140 may have a speaker module hole 114c, through which a portion of the speaker module 114b protrudes from the support member 140.

Circuit boards 118a and 118b are mounted at the support member 140. The circuit boards 118a and 118b may be implemented as the controller 160 (refer to FIG. 7) for performing various operations in the portable terminal 100.

Referring to the drawing, the first circuit board 118a is mounted on said one surface 140a of the support member 140, and the second circuit board 118b is mounted on said another surface 140b thereof. The second circuit board 118b may be implemented, for instance, as a Flexible Printed Circuit Board (FPCB).

The first circuit board 118a may have a direct electrical connection to an electronic component, e.g., the speaker module 114b and the like. The first circuit board 118a may electrically be connected to the electronic component used to activate a variety of functions of the portable terminal 100 through the medium of the second circuit board 118b.

Connection terminals 151 to 153 are mounted onto the surfaces of the first and second circuit boards 118a and 118b by Surface Mount Technology (SMT).

The first connection terminal 151 may be mounted onto the surface of the first circuit board 118a. The second circuit board 118b may include a first area 118b' and a second area 118b". The intermediate connection terminal 152 is mounted onto the surface of the first area 118b', and the second connection terminal 153 electrically connected to the intermediate connection terminal 152 is mounted onto the surface of the second area 118b".

The support member 140 may include a first through-hole 141 which corresponds to the first area 118b' and passes the first connection terminal 151 or the intermediate connection terminal 152 therethrough. If the first and second circuit boards 118a and 118b are respectively mounted onto both surfaces 140a and 140b of the support member 140, the first connection terminal 151 and the intermediate connection terminal 152 come in contact with each other through the first through hole 141. Accordingly, the first and second circuit boards 118a and 118b are electrically connected to each other.

An electrical connection between the intermediate connection terminal 152 and the second connection terminal 153 is performed by a circuit pattern formed on the second circuit board 118b. For this, the circuit pattern may be configured such that its one end is connected to the intermediate connection terminal 152 and another end thereof is connected to the second connection terminal 153.

The support member 140 may include a second through-hole 142 which corresponds to the second area 118b" and passes the second connection terminal 153 or at least a portion of the electronic component therethrough. The electronic component may be, for instance, the broadcast signal receiving antenna 131, the antenna for mobile communication, or the like. The broadcast signal receiving antenna 131 may be a Radio Frequency (RF) antenna.

A contact portion 131a may be formed at the broadcast signal receiving antenna 131 for contacting the second connection terminal 153. Referring to the drawing, the contact portion 131a may be coupled to the rear case 121, and the broadcast signal receiving antenna 131 may be retractable from the rear case 121 while contacting the contact portion 131a.

If the rear case 121 is coupled to the front case 111, the second connection terminal 153 contacts the contact portion 131a through the second through-hole 142. Thusly, the second circuit board 118b is electrically connected to the broadcast signal receiving antenna 131.

As so far described, the first and intermediate connection terminals 151 and 152 contact each other, the intermediate and second connection terminals 152 and 153 are connected by the circuit pattern of the second circuit board 118b, and the second connection terminal 153 and the contact portion 131a contact each other, thus to electrically connect the broadcast signal receiving antenna 131 and the first circuit board 118a. With such described electrical connection, there is no need to have a separate coaxial cable, a connector and the like, thus to simplify its structure and have no cable disconnection.

The connection terminals 151 to 153 may be formed of an elastic member, e.g., a conductive rubber material.

The connection terminals 151 to 153 may have elasticity and conductivity by covering its outer portion formed of a rubber material with a thin metallic material.

The first connection terminal 151 includes a first contact surface 151' which contacts the intermediate connection terminal 152. The first contact surface 151' is formed to parallel to the surface of the first circuit board 118a. The intermediate connection terminal 152 includes an intermediate contact surface 152' which protrudes from the second circuit board 118b and contacts the first contact surface 151'. If the sum of the protruding lengths of the first and intermediate contact surfaces 151' and 152' is greater than a distance spaced between the first and second circuit boards 118a and 118b when the first and second circuit boards 118a and 118b are coupled, the first and intermediate connection terminals 151 and 152 would elastically be deformed while pressing each other. Such press causes the first and intermediate contact surfaces 151' and 152' to have a surface-to-surface contact. As they have the surface-to-surface contact, a contact area increases, thus to enable more stable electrical connection.

The second connection terminal 153 may include a second contact surface 153' which protrudes from the second circuit board 118b and contacts a portion of the electronic component to be contacted. Similar to the scheme in which the first and the intermediate contact surfaces 151' and 152' have the surface-to-surface contact, it would be apparent to those skilled in the art that the second contact surface 153' would have a surface-to-surface contact with the contact portion 131a. Therefore, detailed explanations thereof are omitted.

As shown in the drawing, at least one switch 116b may be mounted on the second circuit board 118b so as to correspond to the manipulation pad 116a. The user may input information, data, or the like by pressing the manipulation pad 116a. A microphone may be disposed below the switch 116b for receiving an external audio signal (audible sound).

The sound hole 114a, the speaker module 114b and the speaker module hole 114c may be categorized into the first audio output unit 114, and the video window 115a and the camera module 115b may be categorized into the first video input unit 115. The manipulation pad 116a and the switch 116b may be categorized into the first user input unit 116 (refer to FIG. 1).

Figure 5:
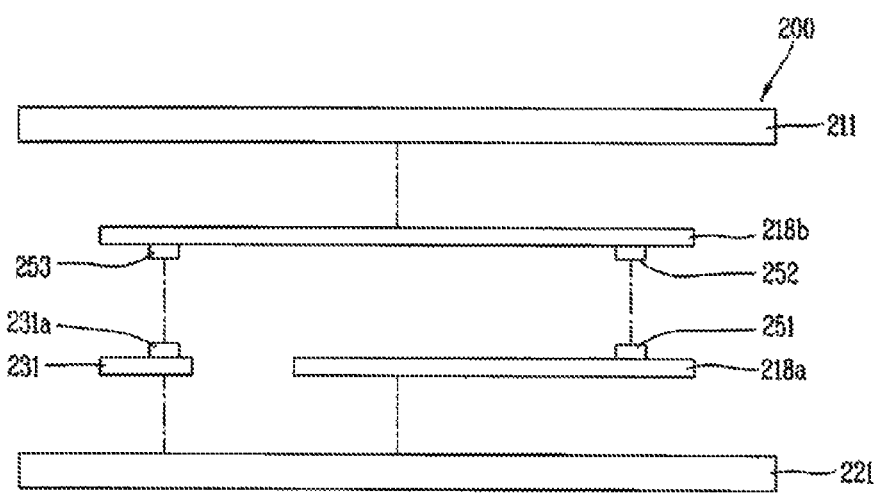
FIG. 5 is a schematic view showing a coupling relation of a portable terminal according to another exemplary embodiment of the present invention.

FIG. 5 is a schematic view showing a coupling relation of a portable terminal 200 according to another exemplary embodiment of the present invention. This example does not have the support member 140 (refer to FIG. 3) as compared to the previous example.

A first circuit board 218a on which a first connection terminal 251 is mounted is coupled to a front case 211. A second circuit board 218b on which intermediate and second connection terminals 252 and 253 are mounted is coupled to a rear case 221 or the front case 211 so as to cover at least a portion of the first circuit board 218a. An electronic component having at least a portion thereof contacting the second connection terminal 253 (e.g., a broadcast signal receiving antenna 231) may be mounted at the rear case 221.

If the front case 211 and the rear case 221 are coupled, the first and intermediate connection terminals 251 and 252 come in contact with each other, and the second connection terminal 253 and the contact portion 231a come in contact with each other. Due to such coupling and contact relationships, the broadcast signal receiving antenna 231 is electrically connected to the first circuit board 218a. This coupling scheme may configure a portable terminal 200 to be thinner, without requiring any additional structure onto which the first and second circuit boards 218a and 218b are attached.

Figure 6:
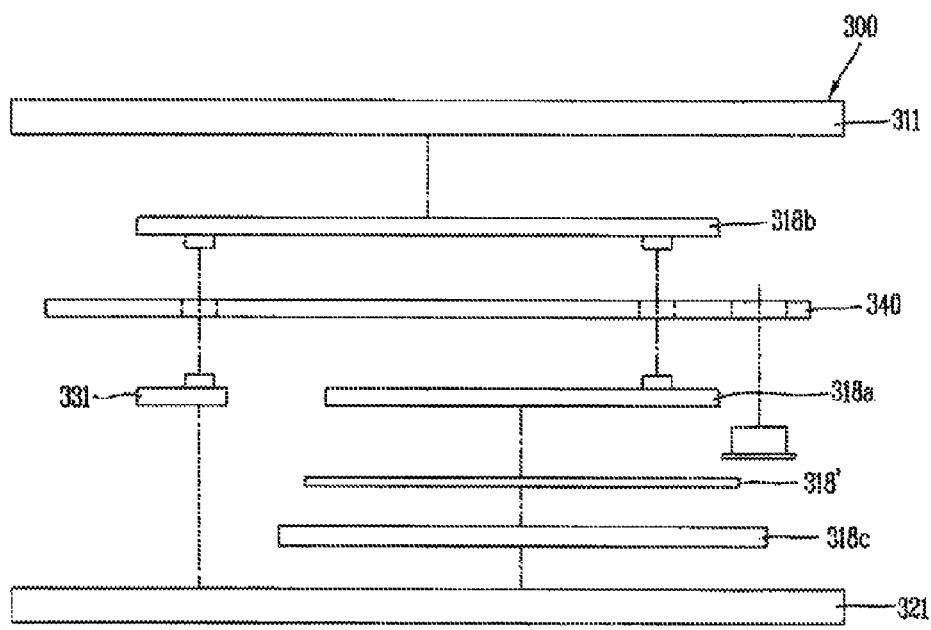
FIG. 6 is a schematic view showing a coupling relation of a portable terminal according to still another exemplary embodiment of the present invention.

FIG. 6 is a schematic view showing a coupling relation of a portable terminal 300 according to still another exemplary embodiment of the present invention.

A support member 340 is coupled to a front case 311, and a broadcast signal receiving antenna 331 is coupled to a rear case 321.

First and second circuit boards 318a and 318b are respectively disposed on both surfaces of the support member 340. The first circuit board 318a is electrically connected to the broadcast signal receiving antenna 331, similar to the electric connection of the portable terminal 100 as shown in FIGS. 3 and 4.

A third circuit board 318c is mounted at the support member 340 so as to cover at least a portion of the first circuit board 318a. The third circuit board 318c is electrically connected to the first and second circuit boards 318a and 318b, and may have a direct electrical connection to an electronic component (e.g., a camera module to implement the second video input unit 127, refer to FIG. 2). Since the third circuit board 318c is configured with the first and second circuit boards 318a and 318b in a layered manner, the controller 160 may have more functions even in a limited area.

A protection sheet 318' is disposed between the first and third circuit boards 318a and 318c. The protection sheet 318' may be formed of a metallic material, or have at least a portion of an insulating material coated with an EMI shielding material. This enables the protection sheet 318' to shield (block) electromagnetic waves proceeding (moving) to the first or the third circuit boards 318a or 318c. In order to shield the electromagnetic waves, the protection sheet 318' is configured to reflect or absorb a portion of the electromagnetic waves proceeding to the first or third circuit boards 318a or 318c.

Figure 7:
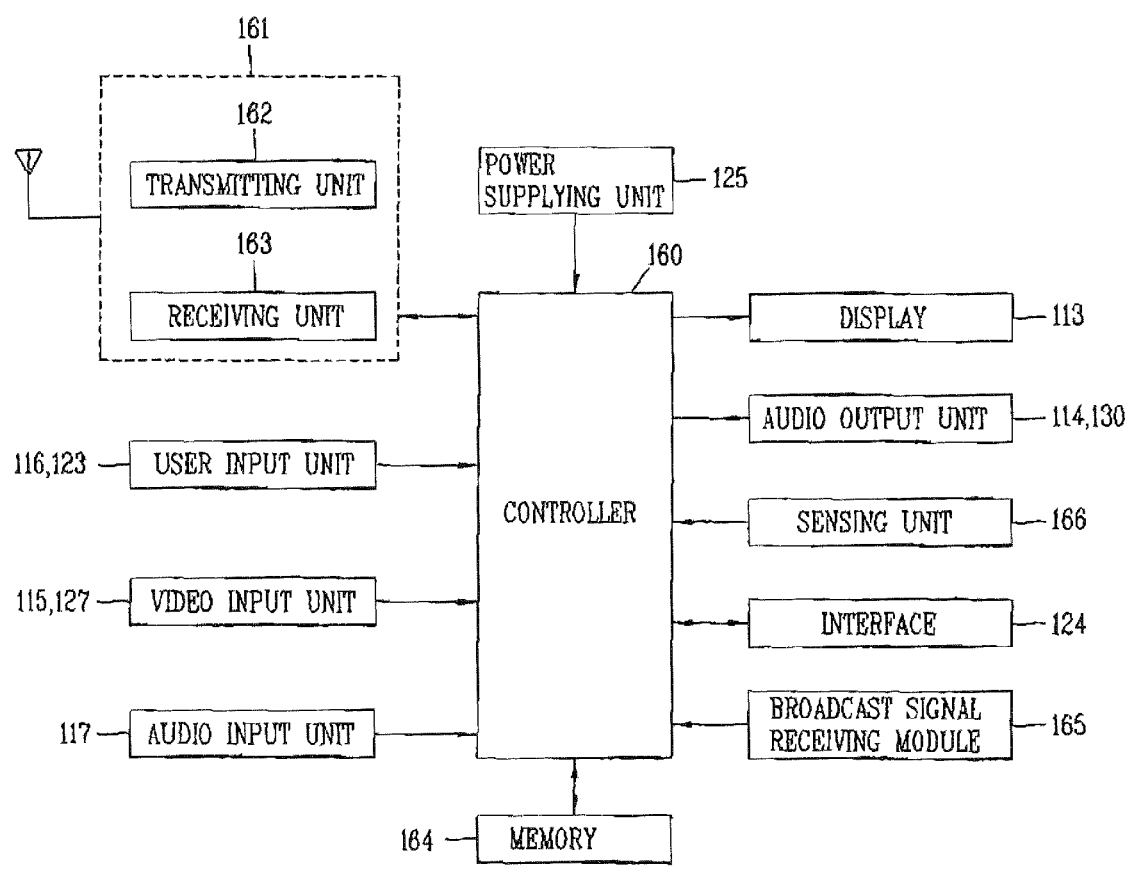
FIG. 7 is a block diagram of the portable terminal according to one exemplary embodiment of the present invention.

FIG. 7 is a block diagram of the portable terminal according to one exemplary embodiment of the present invention.

Referring to FIG. 7, the portable terminal according to one exemplary embodiment of the present invention may include a wireless communication unit 161, user input units 116, 123, video input units 115, 127, audio input unit 117, the display 113, audio output units 114, 130, a sensing unit 166, an interface 124, a broadcast signal receiving module 165, a memory 164, a power supplying unit 125, a controller 160 and the like.

The controller 160 typically controls the general operations of the portable terminal. For example, the controller 160 performs controlling and processing associated with voice calls, data communications, video calls, and the like. In addition, the controller 160 may perform a control of additional operations of the portable terminal, in addition to the general control functions.

The wireless communication unit 161 transmits and receives wireless signals to/from one or more network entities (e.g., base station, Node-B) via an antenna. For instance, the wireless communication unit 161 handles transmission and reception of data (audio data, a text message, video and a control data) under the control of the controller 160, and includes a transmitting unit 162 for modulating a signal to be transmitted and a receiving unit 163 for demodulating the received signal.

The user input units 116 and 123 generate key input data inputted by a user to control various operations of the portable terminal. The user input units 116 and 123 may include a dome switch, a touch pad (e.g., a touch sensitive member that detects changes in resistance, pressure, capacitance, etc.), a jog wheel, a jog switch, and the like.

The video input units 115 and 127 is configured to process image frames of still pictures or videos obtained by an image capture device (image sensor) in a video call mode or an image capturing mode. The processed image frames may be converted for output into a format (image data) to be displayed on the display 113. The image frames processed by the video input units 115 and 127 may be stored in the memory 164 or transmitted via the wireless communication unit 161 under the control of the controller 160.

The audio input unit 117 may receive an external analog audio signal (audible sound) via a microphone (or the like) in a phone call mode, a recording mode, a voice recognition mode, etc., and process it into digital data. The processed audio (voice) data may be converted for output into a format transmittable to a mobile communication base station via the wireless communication unit 161 in case of the phone call mode. In case of the recording mode, the audio input unit 117 may store the processed audio data in the memory 164. The audio input unit 117 may include various types of noise canceling (or suppression) algorithms to cancel (or suppress) noise generated in the course of receiving and transmitting audio signals.

The display 113 may output information processed in the portable terminal. For example, when the portable terminal is in the phone call mode, the display 113 may display a User Interface (UI) or a Graphic User Interface (GUI) associated with a call or other communication on a screen display thereof under the control of the controller 160. When the portable terminal is in the video call mode or the image capturing mode, the display 113 may display a captured and/or received image, a UI, a GUI, and the like on its screen display under the control of the controller 160. Meanwhile, when the display 113 and the touch pad are overlaid in a layered manner to form a touch screen, the display 113 may function as an input device as well as an output device.

The audio output units 114 and 130 may output audio data received from the wireless communication unit 161 or stored in the memory 164, under the control of the controller 160, in a call signal reception mode, a call mode, a recording mode, a voice recognition mode, a broadcast reception mode, and the like. Also, the audio output units 114 and 130 may provide audible outputs related to a particular function (e.g., a call signal reception sound, a message reception sound, etc.) performed by the portable terminal. The audio output units 114 and 130 may include a speaker, a receiver, a buzzer, or the like.

The sensing unit 166 detects a current status (or state) of the portable terminal such as an opened/closed state of the portable terminal, a location of the portable terminal, a presence or absence of user contact with the portable terminal, or the like, and generates commands or signals for controlling the operation of the portable terminal. For example, when the portable terminal is a slide type portable phone, the sensing unit 166 may sense whether the slide phone is opened or closed, and output the sense result to the controller 160, thus to control the operation of the portable terminal. Other examples include the sensing unit 166 sensing the presence or absence of power provided by the power supplying unit 125, the presence or absence of a coupling or other connection between the interface 124 and an external device, or the like.

The interface 124 serves as an interface with at least one external device connected with the portable terminal. For example, the external devices may include wired/wireless headset ports, external power charger ports, wired/wireless data ports, card sockets, e.g., memory card ports, Subscriber Identity Module (SIM) cards/User Identity Module (UIM) cards, among others. The interface 124 may be used to receive inputs (e.g., data, information, power, etc.) from an external device and transfer the received inputs to one or more elements within the portable terminal or may be used to transfer data from the portable terminal to an external device.

The memory 164 may store software programs or the like used for the processing and controlling performed by the controller 160, or may temporarily store inputted/outputted data (e.g., a phonebook, messages, still images, video, etc.). In addition, the memory 164 may store software programs to perform a control of operations of the portable terminal according to the present invention. The memory 164 may include at least one type of storage medium including a flash memory type, a hard disk type, a card-type memory (e.g., SD or XD memory, etc), a Random Access Memory (RAM), a Static Random Access Memory (SRAM), a Read-Only Memory (ROM), an Electrically Erasable Programmable Read-Only Memory (EEPROM), a Programmable Read-Only memory (PROM) magnetic memory, a magnetic disk, an optical disk, and the like.

The broadcast signal receiving module 165 receives a broadcast signal and/or broadcast associated information from an external broadcast managing server via a broadcast channel, and converts the received broadcast signal or information into a format to be outputted to the audio output units 114 and 130, and the display 113, thus to output the same to the controller 160. Here, the broadcast channel may include a satellite channel and a terrestrial channel. In addition, the broadcast signal receiving module 165 may receive additional broadcast associated information (e.g., an electronic program guide (EPG), a channel list, and the like). The broadcast signal and additional broadcast associated information converted by the broadcast signal receiving module 165 may be stored in the memory 164.

The power supplying unit 125 receives external or internal power and supplies power required for the operations of the respective elements under the control of the controller 160.

With such described configurations, the portable terminal according to the present invention may have an electrical connection with a simplified structure in that the first circuit board and the electronic component are electrically connected by the medium of the second circuit board.

In addition, the present invention may have a stable electrical connection since the connection terminals have elasticity and the contact surfaces are formed to correspond to one another.

The foregoing embodiments and advantages are merely exemplary and are not to be construed as limiting the present disclosure. The present teachings can be readily applied to other types of apparatuses. This description is intended to be illustrative, and not to limit the scope of the claims. Many alternatives, modifications, and variations will be apparent to those skilled in the art. The features, structures, methods, and other characteristics of the exemplary embodiments described herein may be combined in various ways to obtain additional and/or alternative exemplary embodiments.

As the present invention may be embodied in several forms without departing from the characteristics thereof, it should also be understood that the above-described embodiments are not limited by any of the details of the foregoing description, unless otherwise specified, but rather should be construed broadly within its scope as defined in the appended claims, and therefore all changes and modifications that fall within the metes and bounds of the claims, or equivalents of such metes and bounds are therefore intended to be embraced by the appended claims.

What is claimed is:

1. A portable terminal, comprising:
   a first circuit board coupled to a main body and comprising a first connection terminal;
   a second circuit board coupled to the main body and covering at least a portion of the first circuit board, the second circuit board comprising:
     a first area including an intermediate connection terminal contacting the first connection terminal, and
     a second area including a second connection terminal electrically connected to the intermediate connection terminal; and
   an electronic component electrically connected to the first circuit board,
   wherein at least a portion of the electronic component contacts the second connection terminal,
   wherein at least the first connection terminal, the intermediate connection terminal, or the second connection terminal is an elastic member,
   wherein the elastic member includes a metallic member and a rubber material member, and
   wherein the metallic member covers an outer portion of the rubber material member such that opposite surfaces of the rubber material member are electronically connected to each other.

2. The portable terminal of claim 1, further comprising:
   a support member coupled to the main body,
   wherein the first circuit board is mounted on a first surface of the support member and the second circuit board is mounted on a second surface of the support member.

3. The portable terminal of claim 2, wherein the support member includes a first through-hole corresponding to the first area for passing the first connection terminal or the intermediate connection terminal therethrough, and a second through-hole corresponding to the second area for passing the second connection terminal or at least a portion of the electronic component therethrough.

4. The portable terminal of claim 1, wherein the first connection terminal and the intermediate connection terminal press each other when contacting each other.

5. The portable terminal of claim 1, wherein the second connection terminal and at least the portion of the electronic component press each other when contacting each other.

6. The portable terminal of claim 1, wherein a first end of a circuit pattern of the second circuit board is connected to the intermediate connection terminal and a second end of the circuit pattern is connected to the second connection terminal.

7. The portable terminal of claim 1,
   wherein the first connection terminal includes a first contact surface which protrudes from a surface of the first circuit board where the first connection terminal is mounted and is parallel to the surface,
   wherein the intermediate connection terminal includes an intermediate contact surface which protrudes from the second circuit board and contacts the first contact surface, and
   wherein the second connection terminal includes a second contact surface which protrudes from the second circuit board and contacts a portion of the electronic component to be contacted.

8. The portable terminal of claim 7, wherein the first connection terminal and the intermediate connection terminal press each other when contacting each other, and
   wherein the first contact surface and intermediate contact surface are elastically deformed while pressing each other.

9. The portable terminal of claim 7, wherein the second connection terminal and at least the portion of the electronic component press each other when contacting each other, and
   wherein the second contact surface and the portion of the electronic component are elastically deformed while pressing each other.

10. The portable terminal of claim 1, wherein the electronic component is an antenna.

11. The portable terminal of claim 1, further comprising:
    a third circuit board covering at least a portion of the first circuit board electrically connected to the first circuit board.

12. The portable terminal of claim 11, further comprising:
    a protection sheet, disposed between the first circuit board and third circuit board, configured to reflect or absorb electromagnetic waves.

* * * * *